United States Patent
Tai et al.

(10) Patent No.: US 9,837,323 B2
(45) Date of Patent: Dec. 5, 2017

(54) SEMICONDUCTOR STRUCTURE AND FABRICATION METHOD THEREOF

(71) Applicant: Semiconductor Manufacturing International (Shanghai) Corporation, Shanghai (CN)

(72) Inventors: Chih Chun Tai, Shanghai (CN); Lei Fang, Shanghai (CN); Dae Sub Jung, Shanghai (CN); Gangning Wang, Shanghai (CN); Guangli Yang, Shanghai (CN); Jiao Wang, Shanghai (CN); Hong Sun, Shanghai (CN); Yunpeng Peng, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/196,666

(22) Filed: Jun. 29, 2016

(65) Prior Publication Data

US 2017/0005094 A1  Jan. 5, 2017

(30) Foreign Application Priority Data

Jun. 30, 2015  (CN) .......................... 2015 1 0373554

(51) Int. Cl.
| | |
|---|---|
| *H01L 21/8238* | (2006.01) |
| *H01L 27/092* | (2006.01) |
| *H01L 29/66* | (2006.01) |
| *H01L 29/08* | (2006.01) |
| *H01L 29/78* | (2006.01) |
| *H01L 29/36* | (2006.01) |

(52) U.S. Cl.
CPC ................ *H01L 21/823892* (2013.01); *H01L 21/823814* (2013.01); *H01L 27/0928* (2013.01); *H01L 29/0847* (2013.01); *H01L 29/36* (2013.01); *H01L 29/66598* (2013.01); *H01L 29/7833* (2013.01)

(58) Field of Classification Search
CPC ......... H01L 27/0928; H01L 21/823814; H01L 21/823892; H01L 29/0847; H01L 29/36; H01L 29/66598; H01L 29/7833
See application file for complete search history.

(56) References Cited

U.S. PATENT DOCUMENTS

| | | | | |
|---|---|---|---|---|
| 4,590,663 | A * | 5/1986 | Haken | ............... H01L 21/02238 257/336 |
| 6,201,444 | B1 * | 3/2001 | Sevic | ..................... H03F 1/301 330/288 |
| 2001/0038122 | A1 * | 11/2001 | Matsuzaki | ............ H01L 21/266 257/339 |

(Continued)

*Primary Examiner* — Fei Fei Yeung Lopez
(74) *Attorney, Agent, or Firm* — Anova Law Group, PLLC

(57) ABSTRACT

The present disclosure provides a method for forming a semiconductor structure. The method includes providing a semiconductor substrate; forming a first active region, a second active region, a third active region, and a fourth active region in the semiconductor substrate; and forming a middle-voltage P well region (MVPW) in each of the first active region and the second region simultaneously and forming a middle-voltage N well (MVNW) region in each of the third active region and the fourth active region simultaneously.

19 Claims, 9 Drawing Sheets

(56) References Cited

U.S. PATENT DOCUMENTS

| | | | |
|---|---|---|---|
| 2003/0170969 A1* | 9/2003 | Ishida | H01L 21/28518 |
| | | | 438/596 |
| 2005/0186748 A1* | 8/2005 | Hasumi | H01L 21/82341 |
| | | | 438/305 |
| 2005/0227440 A1* | 10/2005 | Ema | H01L 21/82385 |
| | | | 438/275 |
| 2005/0253197 A1* | 11/2005 | Tokushige | H01L 21/84 |
| | | | 257/347 |
| 2006/0092700 A1* | 5/2006 | Watanabe | H01L 27/0207 |
| | | | 365/185.05 |
| 2007/0075354 A1* | 4/2007 | Ono | H01L 27/115 |
| | | | 257/315 |
| 2011/0221000 A1* | 9/2011 | Shima | H01L 21/82341 |
| | | | 257/344 |

* cited by examiner

SEMICONDUCTOR STRUCTURE AND FABRICATION METHOD THEREOF

CROSS-REFERENCES TO RELATED APPLICATIONS

This application claims the priority of Chinese Patent Application No. 201510373554.0 filed on Jun. 30, 2015, the entire content of which is incorporated herein by reference.

FIELD OF THE DISCLOSURE

The present disclosure relates to the field of semiconductor technology, more particularly, relates to a semiconductor structure and a fabrication method for forming the semiconductor structure.

BACKGROUND

Higher integration level of integrated circuits (ICs) have resulted semiconductor devices to have decreasing sizes. As the semiconductor devices have developed to have higher distribution density and smaller sizes, metal-oxide-semiconductor (MOS) devices have become a main driving force of the semiconductor technology. For example, complementary metal-oxide-semiconductor (CMOS) transistors make up a main basic element/unit in logic circuits nowadays. A CMOS transistor circuit often includes P-type MOS (PMOS) transistors and N-type MOS (NMOS) transistors. A PMOS transistor or an NMOS transistor is often disposed on a doped well. A PMOS transistor (or an NMOS transistor) often includes a gate electrode, a P-type (or an N-type) source/drain electrode in the substrate on two sides of the gate electrode, and a channel region between the source electrode and the drain electrode.

In existing semiconductor technology, the formation of a PMOS/an NMOS transistor with predictable/desired performance often includes controlling the formation of the gate oxide layer, the channel region, the well region, and the pocket implantation region. The formation of a PMOS transistor/an NMOS transistor also includes controlling the doping profile of the extended source/drain region and the implantation profile of the source/drain electrode, and controlling the thermal budget of the fabrication process. To obtain a PMOS/an NMOS transistor with desired performance, the two most common ways include tuning certain implantation properties of the dopant ions, e.g., implantation type, implantation energy, and implantation dose/concentration, and changing/adjusting the thickness of the gate oxide layer. The two most common ways both require forming doped wells in the semiconductor structure. The formation of the doped wells requires illumination with light of different intensities/types and related photolithography processes for defining doped wells for different parts of the semiconductor structure.

As a result, the fabrication of the semiconductor structure becomes undesirably complicated. The disclosed semiconductor structure and fabricating method are directed to solve one or more problems set forth above and other problems.

BRIEF SUMMARY OF THE DISCLOSURE

The present disclosure provides a semiconductor structure and a fabrication method for forming the semiconductor structure. By applying the semiconductor structure and the fabrication method, the fabrication process of the semiconductor structure can be simplified, and fabrication efficiency can be improved.

One aspect of the present disclosure provides a method for forming a semiconductor structure. The method includes providing a semiconductor substrate; forming a first active region, a second active region, a third active region, and a fourth active region in the semiconductor substrate; and forming a middle-voltage P well region (MVPW) in each of the first active region and the second region simultaneously and forming a middle-voltage N well (MVNW) region in each of the third active region and the fourth active region simultaneously.

Another aspect of the present disclosure provides a semiconductor structure. The semiconductor structure includes a semiconductor substrate; a first active region, including a middle-voltage P well (MVPW) region and a first gate structure on the MVPW region, NMOS lightly-doped-drain implant for low VDD (NLL) regions and N-type heavily-doped regions being formed in the MVPW region on two sides of the first gate structure; a second active region, including an MVPW region and a second gate structure on the MVPW region, NMOS lightly-doped-drain implant for high VDD (NLH) and N-type heavily-doped regions being formed in the MVPW region on two sides of the second gate structure; a third active region, including a middle-voltage N well (MVNW) region and a third gate structure on the MVNW region, NLH regions and P-type heavily-doped regions being formed in the MVNW region on two sides of the third gate structure; and a fourth active region, including an MVNW region and a fourth gate structure on the MVNW region, and P-type heavily-doped regions being formed in the MVNW region on two sides of the fourth gate structure.

Other aspects or embodiments of the present disclosure can be understood by those skilled in the art in light of the description, the claims, and the drawings of the present disclosure

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
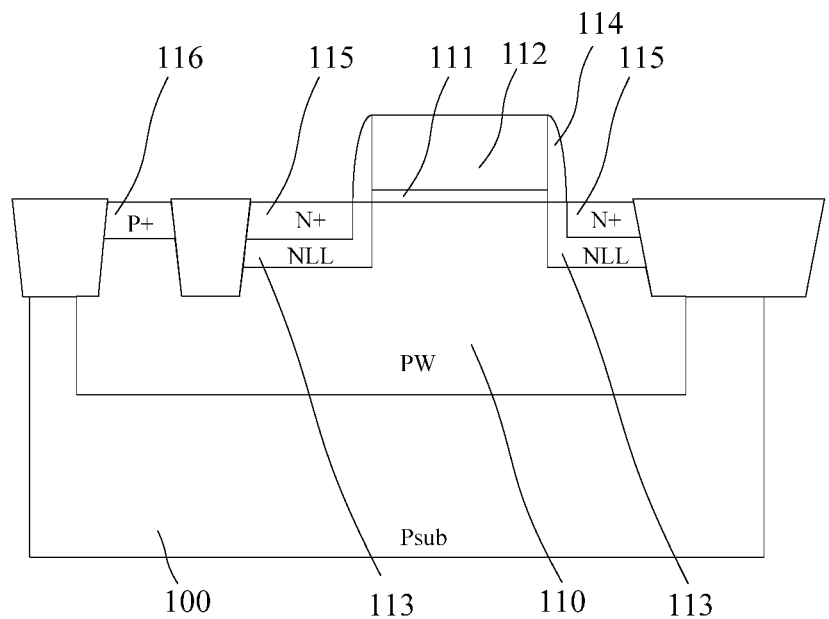
FIGS. 1-4 are cross-sectional views of an existing semiconductor structure.

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

NMOS transistors and PMOS transistors with a supply voltage of 1.8 V are often formed in P wells and N wells, respectively. NMOS transistors and PMOS transistors with a supply voltage of 5 V are often formed in medium-voltage P wells and medium-voltage N wells, respectively. 1.8 V and 5V are the operating voltages for the stated MOS transistors. Thus, the existing fabrication process to form a semiconductor structure can be described in FIGS. 1-4.

At the beginning of the fabrication process, a semiconductor substrate 100 is provided.

Further, a first active region, a second active region, a third active region, and a fourth active region are formed in the semiconductor substrate 100. The active regions are not shown in the figures.

Further, a P well region 110 is formed in the first active region. The P well region is referred to as the PW region 110 in FIG. 1. A middle-voltage P well region 120 is formed in the second active region. The middle-voltage P well region is referred to as the MVPW region 120 in FIG. 2. An N well region 130 is formed in the third active region. The N well region is referred to as the NW 130 in FIG. 3. A middle-voltage N well region 140 is formed in the fourth active region. The middle-voltage N well region is referred to as the MVNW region 140 in FIG. 4.

Further, a first gate electrode structure is formed on the PW region 110 of the first active region. The first gate electrode structure includes a first gate insulating layer 111 and a first gate electrode 112. A second gate electrode structure is formed on the MVPW region 120 of the second active region. The second gate electrode structure includes a second gate insulating layer 121 and a second gate electrode 122. A third gate electrode structure is formed on the N well region 130 of the third active region. The third gate electrode structure includes a third gate insulating layer 131 and a third gate electrode 132. A fourth gate electrode structure is formed on the MVNW region 140 of the fourth active region. The fourth gate electrode structure includes a fourth gate insulating layer 141 and a fourth gate electrode 142.

Figure 2:
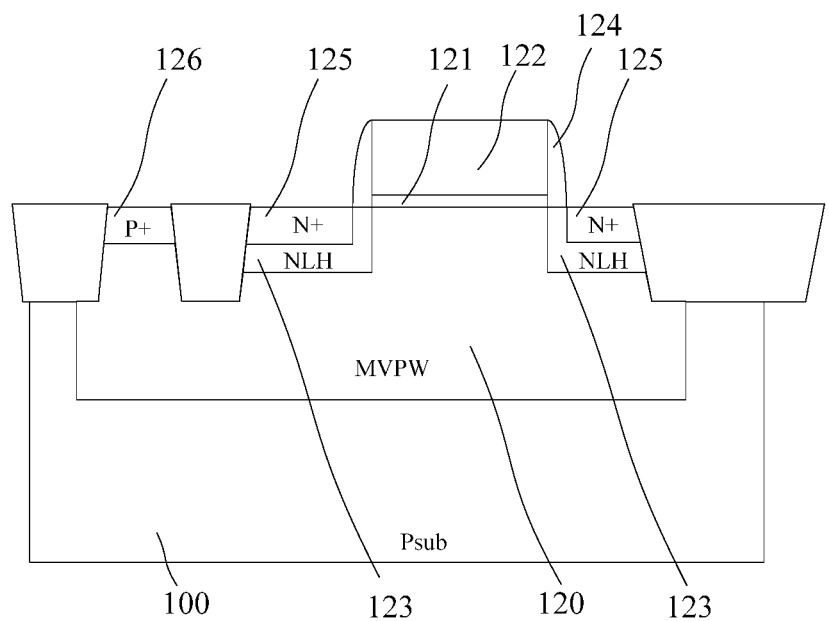
Figure 3:
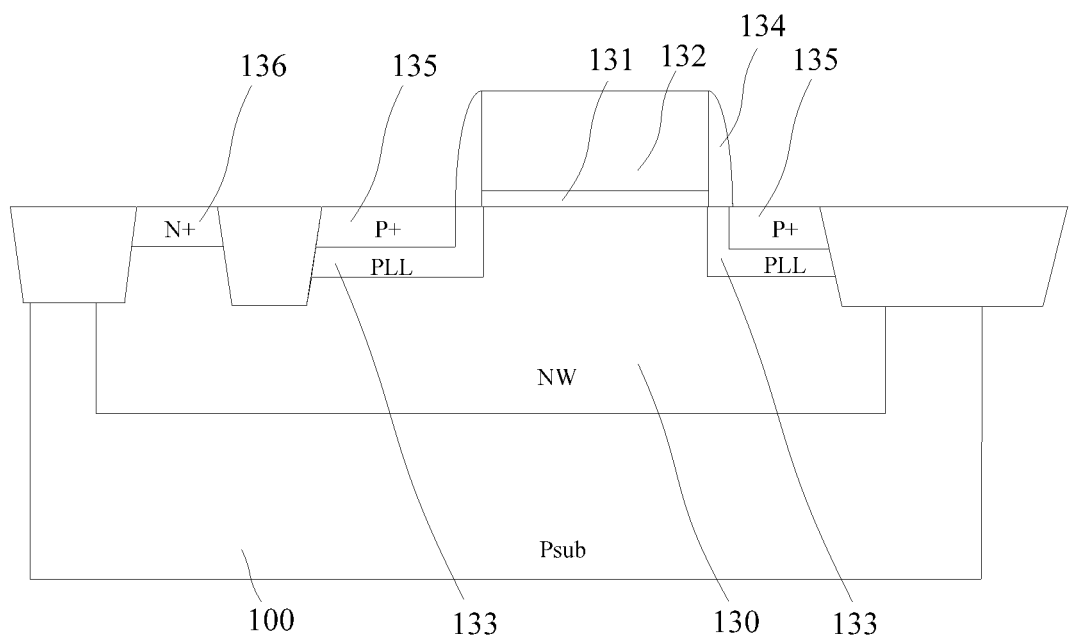
Figure 4:
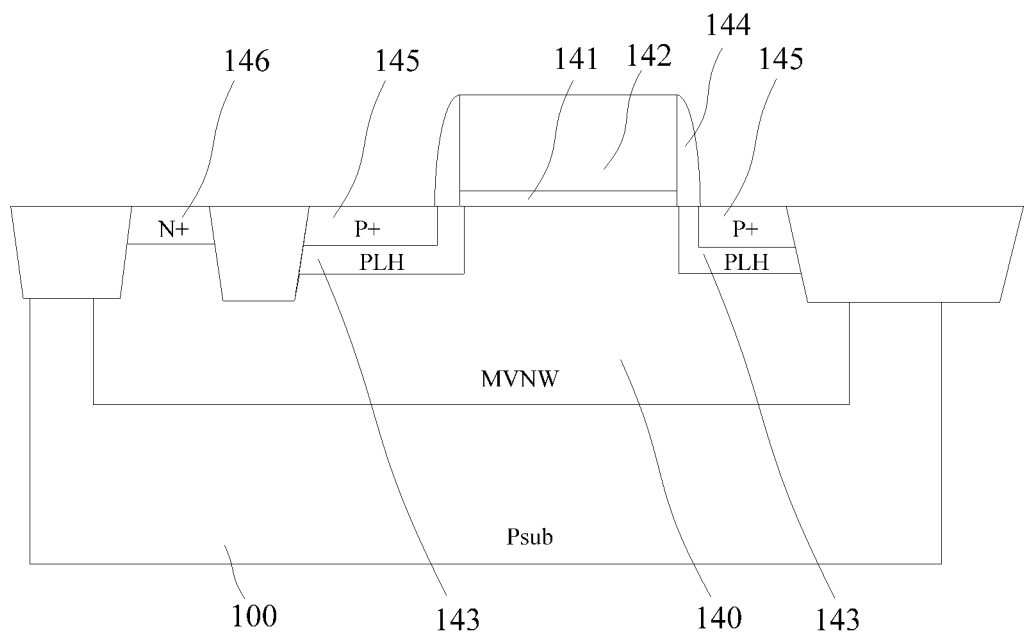

Further, the first gate electrode structure is used as a mask for doping the portions of the semiconductor substrate 100 on two sides of the first gate structure and forming the NMOS lightly-doped-drain implant for low VDD (NLL) region 113, as shown in FIG. 1. VDD refers to the operating voltage of a MOS transistor. The second gate electrode structure is used as a mask for doping the portions of the semiconductor substrate 100 on two sides of the second gate structure and forming the NMOS lightly-doped-drain implant for high VDD (NLH) region 123, as shown in FIG. 2. The third gate electrode structure is used as a mask for doping the portions of the semiconductor substrate 100 on two sides of the third gate structure and forming the PMOS lightly-doped-drain implant for low VDD (PLL) region 133, as shown in FIG. 3. The fourth gate electrode structure is used as a mask for doping the portions of the semiconductor substrate 100 on two sides of the fourth gate structure and forming the PMOS lightly-doped-drain implant for high VDD (PLH) region 143, as shown in FIG. 4.

Further, first sidewall spacers 114 are formed on the two sides of the first gate structure. The first sidewall spacers 114 and the first gate electrode structure are used as the mask for doping the portions of the semiconductor substrate 100 on two sides of the first gate structure. N-type heavily-doped regions 115 (referred to as the first N-type heavily-doped region 115) are formed, as shown in FIG. 1. Second sidewall spacers 124 are formed on the two sides of the second gate structure. The second sidewall spacers 124 and the second gate electrode structure are used as the mask for doping the portions of the semiconductor substrate 100 on two sides of the second gate structure. N-type heavily-doped region 125 (referred to as the second N-type heavily-doped region 125) is formed, as shown in FIG. 2. Third sidewall spacers 134 are formed on the two sides of the third gate structure. The third sidewall spacers 134 and the third gate electrode structure are used as the mask for doping the portions of the semiconductor substrate 100 on two sides of the third gate structure. N-type heavily-doped regions 135 (referred to as the second N-type heavily-doped region 135) are formed, as shown in FIG. 3. Fourth sidewall spacers 144 are formed on the two sides of the fourth gate structure. The fourth sidewall spacers 144 and the fourth gate electrode structure are used as the mask for doping the portions of the semiconductor substrate 100 on two sides of the fourth gate structure. N-type heavily-doped region 135 (referred to as the first N-type heavily-doped region 115) is formed, as shown in FIG. 4.

In addition, a P-type heavily-doped region 116 may be formed in the PW region 110; a P-type heavily-doped region 126 may be formed in the MVPW region 120; an N-type heavily-doped region 136 may be formed in the NW region 130; and an N-type heavily-doped region 146 may be formed in the MVNW region 140.

In the fabrication method described above, four different well regions need to be formed. Four different lightly-doped-drain (LDD) implant doping steps/processes need to be performed to form NLL regions, NLH regions, PLL regions, and PLH regions. The fabrication process may have too many steps and can be costly.

Thus, the present disclosure provides a semiconductor structure and a fabrication method for forming the semiconductor structure. According to the method, after the first active region, the second active region, the third active region, and the fourth active region are formed in the semiconductor substrate, MVPW regions may be formed simultaneously or through the same fabrication step in the first active region and the second active region. MVNW regions may be formed simultaneously or through the same fabrication step in the third active region and the fourth active region. Further, other fabrication steps may be performed subsequently. Because MVPW regions are formed in the first active region and the second active region through the same fabrication step, and MVNW regions are formed in the third active region and the fourth active region through the same fabrication step, at least two photolithography steps can be omitted from conventionally used fabrication process accordingly. The number of fabrication steps may be reduced. The fabrication process thus requires less time and the fabrication efficiency can be improved. The fabrication cost can be reduced.

The disclosure is now illustrated in detail in connection with FIGS. 5-17.

One aspect of the present disclosure provides a fabrication method for forming a semiconductor structure.

In the present disclosure, the semiconductor structures may include an NMOS transistor and a PMOS transistor with an operating voltage of 1.8 V. The semiconductor structure may also include an NMOS transistor and a PMOS transistor with an operating voltage of 5 V. It should be noted that, in other various embodiments of the present disclosure, the semiconductor structure may also be suitable for transistors with different operating voltages. For example, the semiconductor structure may also include NMOS transistors and PMOS transistors with operating voltages lower than 3

V, and/or NMOS transistors and PMOS transistors with operating voltages ranging from about 3 V to about 10 V.

Figure 15:
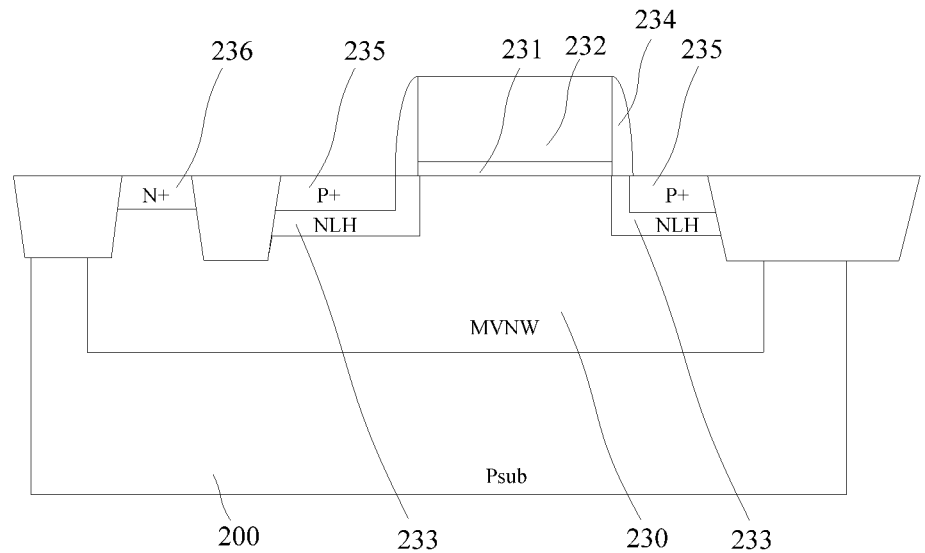
Figure 16:
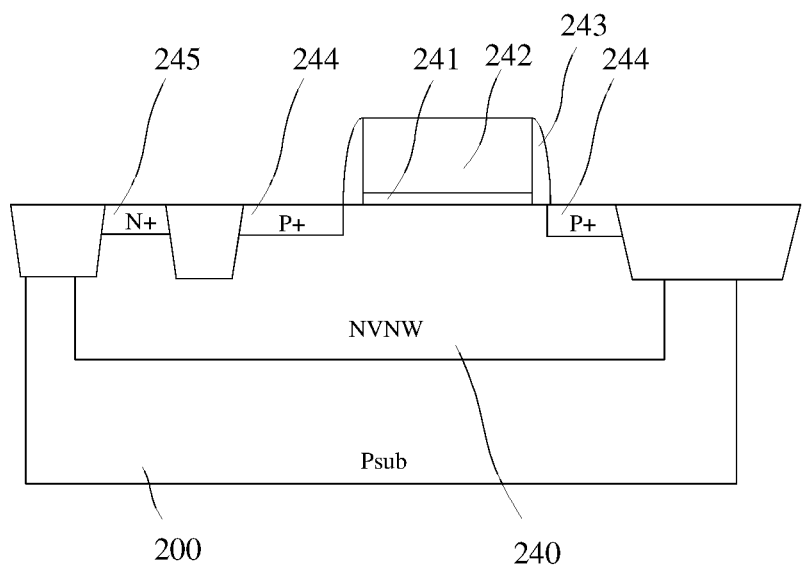
Figure 17:
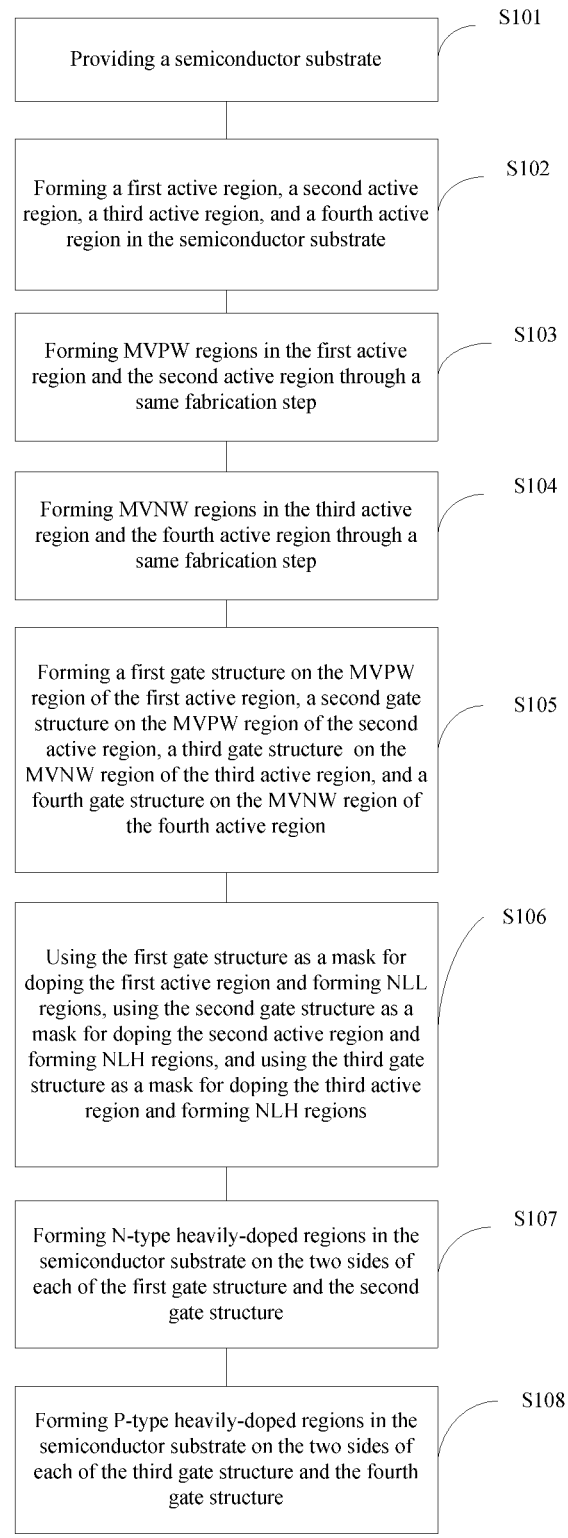
FIG. 17 illustrates an exemplary fabrication process of a semiconductor structure consistent with the disclosed embodiments.

FIG. 17 illustrates an exemplary process of the fabrication method for forming the semiconductor structure. FIGS. 5-16 illustrate an exemplary semiconductor structure corresponding to various stages of an exemplary fabrication process.

As shown in FIG. 17, at the beginning of the fabrication process, a semiconductor substrate is provided (S101). FIGS. 5-8 illustrate the corresponding semiconductor structure.

As shown in FIGS. 5-8, a semiconductor substrate 200 may be provided. In one embodiment, the semiconductor substrate 200 may be made of silicon. In certain other embodiments, the semiconductor substrate may also be made of other suitable materials. In one embodiment, the semiconductor substrate 200 may be a P-type doped semiconductor substrate 200. The semiconductor substrate 200 may also be referred to as a P substrate or a Psub.

Referring to FIG. 17, after the semiconductor substrate is provided, a first active region, a second active region, a third active region, and a fourth active region are formed in the semiconductor substrate (S102). FIGS. 5-8 illustrate the corresponding semiconductor structure.

Figure 5:
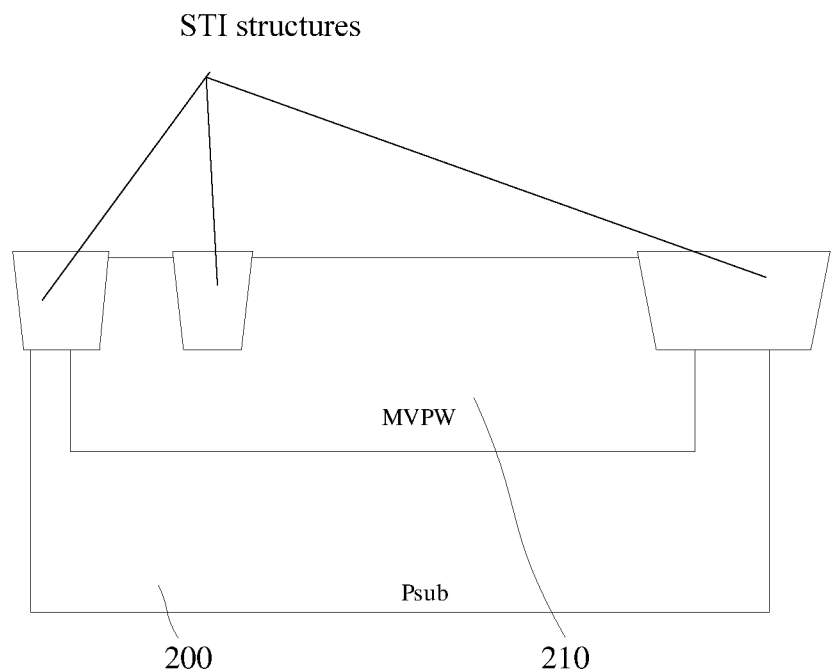
FIGS. 5-16 illustrate an exemplary semiconductor structure corresponding to certain stages of an exemplary fabrication process consistent with the disclosed embodiments.
Figure 6:
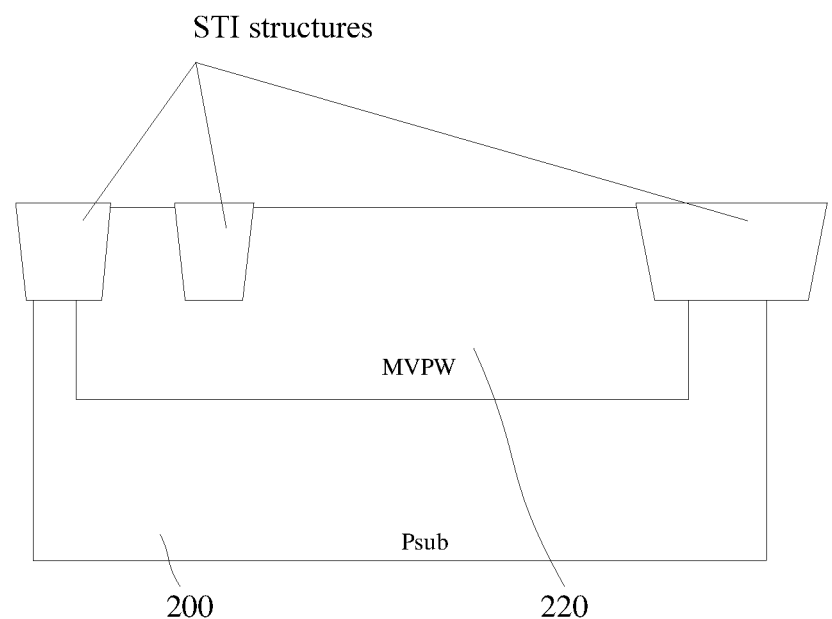
Figure 7:
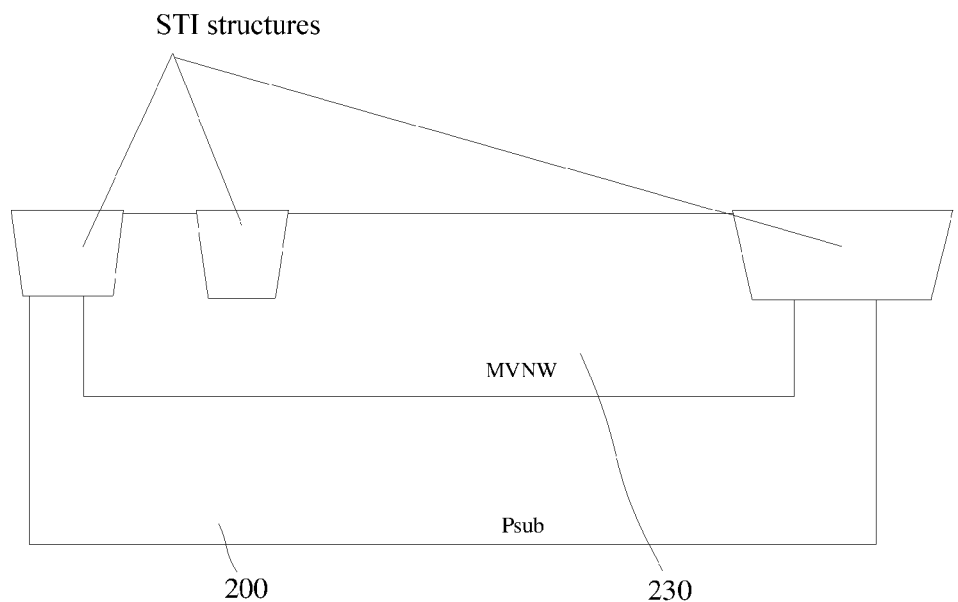
Figure 8:
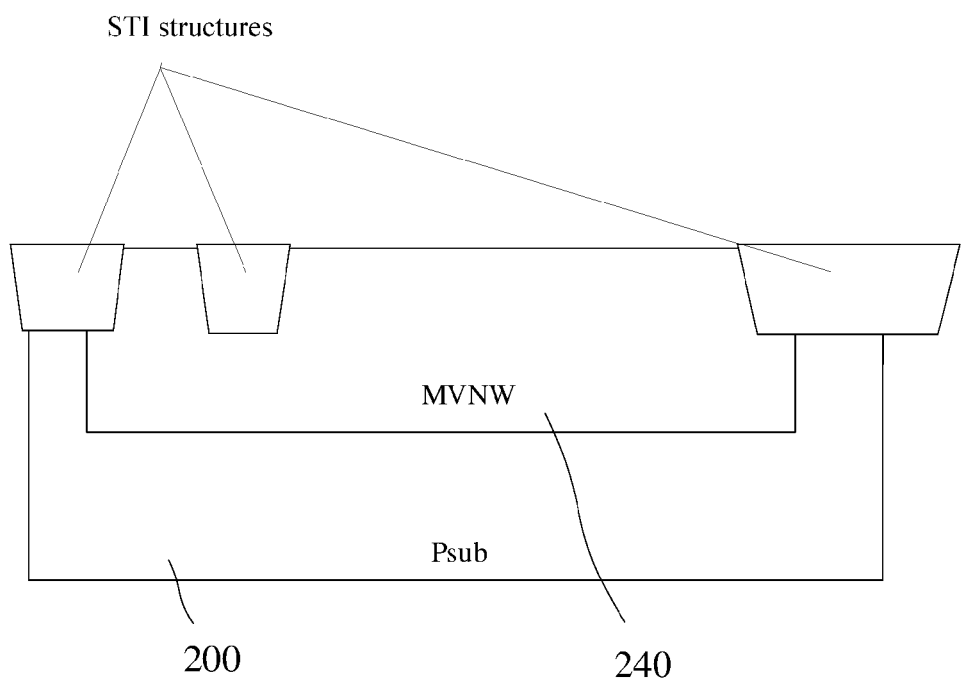

Referring to FIGS. 5-8, a first active region, a second active region, a third active region, and a fourth active region may be formed on the semiconductor substrate 200. The first active region may include a subsequently-formed MVPW region, as shown in FIG. 5. The second active region may include a subsequently-formed MVPW region, as shown in FIG. 6. The third active region may include a subsequently-formed MVNW region, as shown in FIG. 7. The fourth active region may include a subsequently-formed MVNW region, as shown in FIG. 8.

It should be noted that, the first active region, the second active region, the third active region, and the fourth active region may be formed in the same semiconductor substrate 200. For illustrative purposes, the first active region, the second active region, the third active region, and the fourth active region are shown in separate figures. An active region may include the well region formed within the active region and other related structures formed on the well region. For example, a gate structure formed on the well region may be regarded as a part of the corresponding active region.

It should also be noted that, various types of shallow trench isolation (STI) structures may be used to separate or insulate different active regions. The fabrication process to form the STI structures is not described herein. For simplicity, the STI structures are only labeled in FIGS. 5-8.

Referring to FIG. 17, after forming the active regions, MVPW regions are formed through the same fabrication step in the first active region and the second active region (S103). FIGS. 5 and 6 illustrate the corresponding semiconductor structure.

Referring to FIGS. 5 and 6, MVPW regions may be formed simultaneously or through the same fabrication step in the first active region and the second active region. Specifically, an MVPW region 210 may be formed in the first active region, and an MVPW region 220 may be formed in the second active region.

In one embodiment, the process to form the MVPW regions in the first active region and the second region may include the following steps. First, a coating process may be applied on the semiconductor substrate 200 to form a photoresist layer on the semiconductor substrate 200. The photoresist layer may cover the first active region, the second active region, the third active region, and the fourth active region. The thickness of the photoresist layer may be sufficiently thick to prevent or block ion implantation in desired regions. Light of certain wavelengths may be illuminated on the photoresist layer for exposure. After the exposure, a suitable developer may be used to develop the photoresist layer to remove the portions of the photoresist layer on the first active layer and the second active layer so as to expose the surfaces of the first active region and the second active region. A first ion implantation process may be used to dope ions/dopants into the first active region and the second active region. A corresponding MVPW region may be formed in the first active region and the second active region, respectively.

It should be noted that, an MVPW region refers to a well region that is suitable for forming NMOS transistors with operating voltages ranging between about 3V to about 10 V.

In one embodiment, the first ion implantation process may be used to form the MVPW region 210 and the MVPW region 220. The first ion implantation process may be implemented in two steps. In one step or the first step, the implanted ions may be boron ions. The dopant concentration of the boron ions may range from about 1E12 atom/cm$^2$ to about 2.5E12 atom/cm$^2$. The implantation energy of the first ion implantation process may range from about 90 KeV to about 110 KeV. In the other step or the second step, the implanted ions may be $BF_3$ ions. The dopant concentration of the $BF_3$ may range from about 1E12 atom/cm$^2$ to about 2.5E12 atom/cm$^2$. The implantation energy may range from about 10 KeV to about 20 KeV. In certain other embodiments, the boron ions may be implanted in the second step and/or the $BF_3$ ions may be implanted in the first step. The types of ions and the sequence of implantation may be subjected to different applications and should not be limited by the embodiments of the present disclosure.

It should be noted that, when using the existing fabrication method to form the MVPW regions, only one ion implantation is often used. The implanted ions are often boron ions. However, boron ions may easily diffuse into other parts of the semiconductor structure, and the MVPW regions formed through the existing fabrication method may be undesirably unstable. However, in one embodiment, ions/dopants may be implanted into the semiconductor substrate 200 through two implantation steps to form corresponding MVPW regions. Also, in the second implantation step, $BF_3$ ions, which are less easily to diffuse into other parts of the semiconductor substrate 200, may be implanted. MVPW regions with improved stability may be formed. The reliability of the subsequently-formed semiconductor structure can be improved.

Referring to FIG. 17, after forming the MVPW regions, MVNW regions are formed through the same fabrication step in the third active region and the fourth active region (S104). FIGS. 7 and 8 illustrate the corresponding semiconductor structure.

Referring to FIGS. 7 and 8, MVNW regions may be formed simultaneously or through the same fabrication step in the third active region and the fourth active region. Specifically, an MVNW region 230 may be formed in the third active region, and an MVNW region 240 may be formed in the fourth active region.

In one embodiment, the process to form the MVNW regions in the third active region and the fourth region may include the following steps. First, a coating process may be applied to form a photoresist layer on the semiconductor substrate 200. The photoresist layer may cover the first active region, the second active region, the third active region, and the fourth active region. The thickness of the photoresist layer may be sufficiently thick to prevent or block ion implantation in desired regions. Light of certain wavelengths may be illuminated on the photoresist layer for exposure. After the exposure, a suitable developer may be used to develop the photoresist layer to remove the portions of the photoresist layer on the third active layer and the fourth active layer so as to expose the surfaces of the third active region and the fourth active region. The second ion implantation process may be used to dope ions/dopants into the third active region and the fourth active region. A corresponding MVNW region may be formed in the third active region and the fourth active region, respectively.

It should be noted that, an MVNW refers to a well region that is suitable for forming PMOS transistors with operating voltages ranging between about 3V to about 10 V.

In one embodiment, the second ion implantation process may be used to form the MVNW region 230 and the MVPW region 240. The dopant concentration of the second ion implantation process may range from about 1E12 atom/cm$^2$ to about 3E12 atom/cm$^2$. The implantation energy of the second ion implantation process may range from about 70 KeV to about 100 KeV.

It should be noted that, the fabrication processes to form the MVPW regions and the MVNW regions described above may also include other suitable steps or processes besides the ion implantation processes. For example, the fabrication processes may often include a corresponding annealing process. Specifically, after the first ion implantation process and the second ion implantation process, an annealing process may be performed on the first active region, the second active region, the third active region, and the fourth active region. The annealing process may include the following steps. The semiconductor substrate 200 may be heated or thermally treated in H$_2$ with an annealing temperature of about 600 degrees Celsius to about 1000 degrees Celsius to repair lattice damages on the surface of the semiconductor substrate 200 during the ion implantation processes. The annealing process may also electrically activate the implanted/doped ions. The annealing process may enable the doped ions to further diffuse into the semiconductor substrate 200 so that a rapid thermal annealing (RTA) process may be performed to reduce the diffusion of the doped ions.

Referring to FIG. 17, after the MVNW regions are formed, a first gate structure is formed on the MVPW region of the first active region, a second gate structure is formed on the MVPW region of the second active region, a third gate structure is formed on the MVNW region of the third active region, and a fourth gate structure is formed on the MVNW region of the fourth active region (S105). FIGS. 9-12 illustrate the corresponding semiconductor structure.

Figure 9:
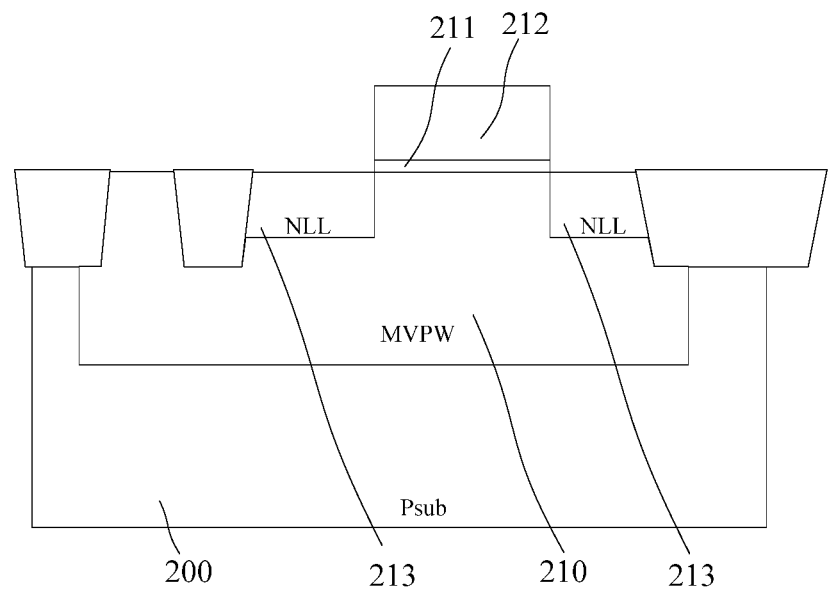

As shown in FIG. 9, a first gate structure may be formed on the MVPW region 210 of the first active region. The first gate structure may include a first gate insulating layer 211 and a first gate electrode 212.

Figure 10:
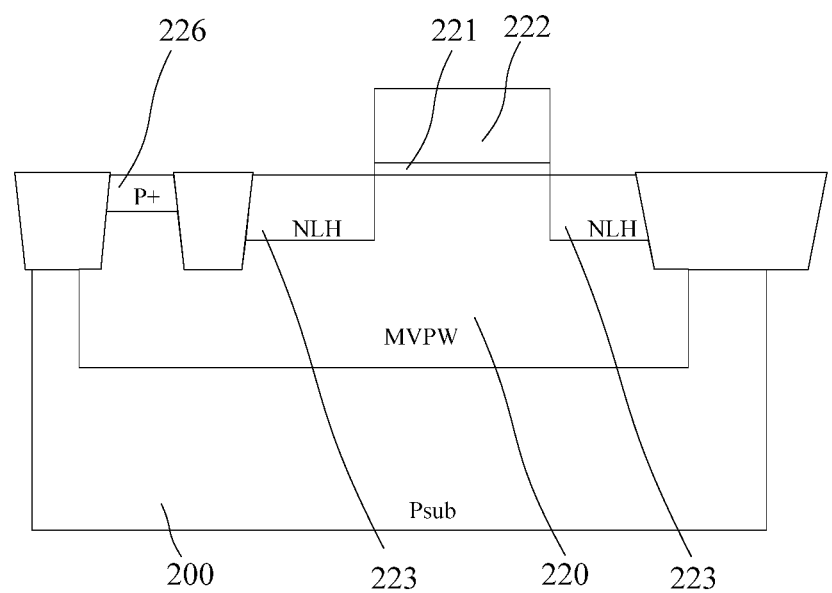

As shown in FIG. 10, a second gate structure may be formed on the MVPW region 220 of the second active region. The second gate structure may include a second gate insulating layer 221 and a second gate electrode 222.

Figure 11:
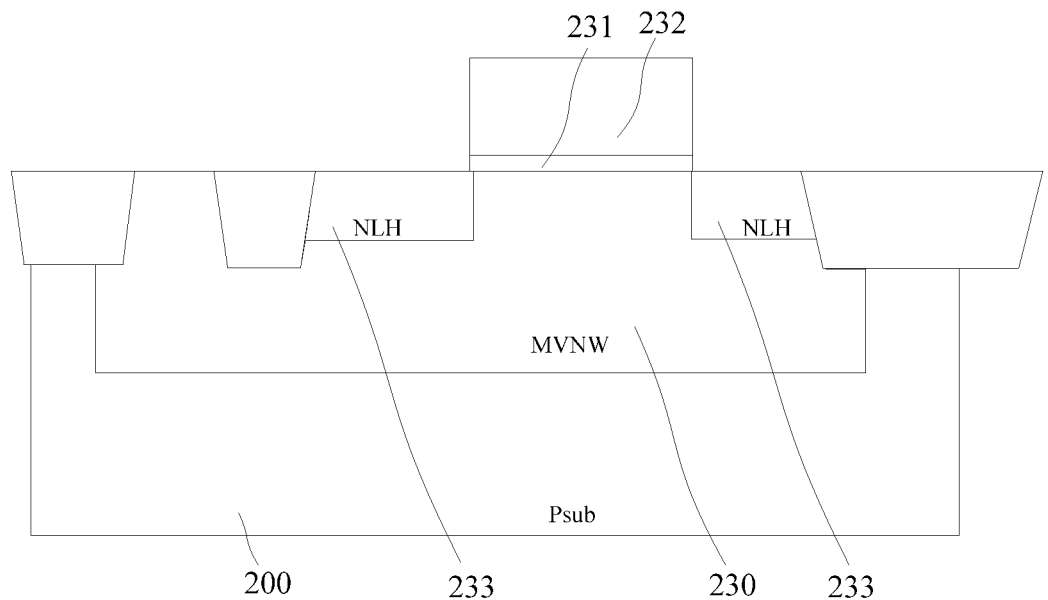

As shown in FIG. 11, a third gate structure may be formed on the MVNW region 230 of the third active region. The third gate structure may include a third gate insulating layer 231 and a third gate electrode 232.

Figure 12:
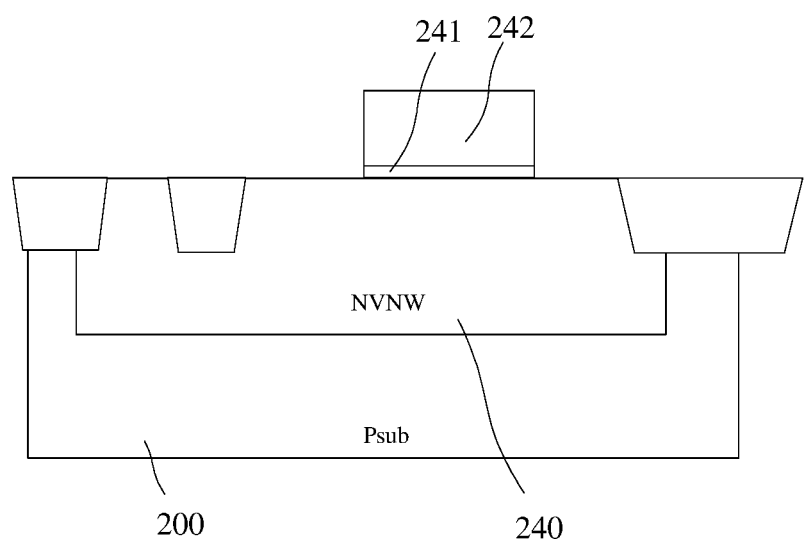

As shown in FIG. 12, a fourth gate structure may be formed on the MVNW region 240 of the fourth active region. The fourth gate structure may include a fourth gate insulating layer 241 and a fourth gate electrode 242.

In one embodiment, the fabrication steps to form the first gate structure, the second gate structure, the third gate structure, and the fourth gate structure are known to those skilled in the art and are not repeated herein.

Referring to FIG. 17, after the gate structures are formed, the first gate structure is used as a mask for doping the first active region and forming NLL regions, the second gate structure is used as a mask for doping the second active region and forming NLH regions, and the third gate structure is used as a mask for doping the third active region and forming NLH regions (S106). FIGS. 9-11 illustrate the corresponding semiconductor structure.

Referring to FIG. 9, the first gate structure may be used as a mask for doping the first active region and forming the NLL regions 213.

In one embodiment, the fabrication process to form the NLL regions 213 may include the following steps. A coating process may be performed to form a photoresist layer on the semiconductor substrate 200. The photoresist layer may cover the first active region, the second active region, the third active region, and the fourth active region. Light of certain wavelengths may be illuminated on the photoresist layer for exposure. After the exposure, a suitable developer may be used to develop the photoresist layer and remove the portion of the photoresist layer on the first active layer. The surface of the first active region may be exposed. The first gate structure may be used as the self-aligned mask and a third ion implantation process may be used to dope the first active region. Thus, the NLL regions 213 may be formed in the first active region.

It should be noted that, before using the first gate structure as the self-aligned mask for forming the NLL regions 213, an oxidation layer (not shown) may be formed on the two sidewalls of the first gate structure. The thickness of the oxidation layer may be sufficiently small. The oxidation layer may be used as offset spacers in the ion implantation process, e.g., the third ion implantation process, to form the NLL regions 213.

In one embodiment, the third ion implantation process, for forming the NLL regions 213, may have a dopant concentration ranging from about 1E13 atom/cm$^2$ to about 2.5E13 atom/cm$^2$. The implantation energy may range from about 20 KeV to about 30 KeV.

Referring to FIG. 10, the second gate structure may be used as the mask for doping the second active region and forming the NLH regions 223.

Referring to FIG. 11, the third gate structure may be used as the mask for doping the third active region and forming the NLH regions 233.

Also, in one embodiment, the second active region and the third active region may be doped through a same fabrication step or simultaneously to form the NLH regions 223 and the NLH regions 233.

In one embodiment, because the second active region and the third active region are doped through the same fabrication step, one photolithography process, i.e., including forming the photoresist layer and the corresponding exposure and development processes, may be omitted from the disclosed fabrication method. The fabrication processes of the semiconductor structure may be further improved. The fabrication of the semiconductor structure may require less time, and fabrication efficiency may be improved. The fabrication of the semiconductor structure may be less costly.

It should be noted that, in certain other embodiments, the NLH regions 223 and the NLH regions 233 may also be formed separately or in different steps.

In one embodiment, a fourth ion implantation may be used to form the NLH regions 223 and the NLH regions 233. The dopant concentration of the fourth ion implantation may range from about 8E12 atom/cm$^2$ to about 1E13 atom/cm$^2$. The implantation energy of the fourth ion implantation process may range from about 60 KeV to about 85 KeV.

Referring to FIG. 12, in one embodiment, no LDD implant regions may be formed in the fourth active region.

As described above, in one embodiment, LDD implant regions, i.e., NLL regions and NLH regions, may only be formed in the first active region, the second active region, and the third active region. No LDD implant region may be formed in the fourth active region. The LDD implant regions in the second active region and the third region may be formed through the same fabrication step or simultaneously. That is, only two LDD ion implantation processes are needed to form the LDD implant regions. Compared to the existing fabrication process, which requires four LDD ion implantation processes, the number of fabrication steps in the disclosed fabrication step may be further reduced. The fabrication of the disclosed semiconductor structure may require less time. Fabrication efficiency may be improved and fabrication cost may be reduced.

Figure 13:
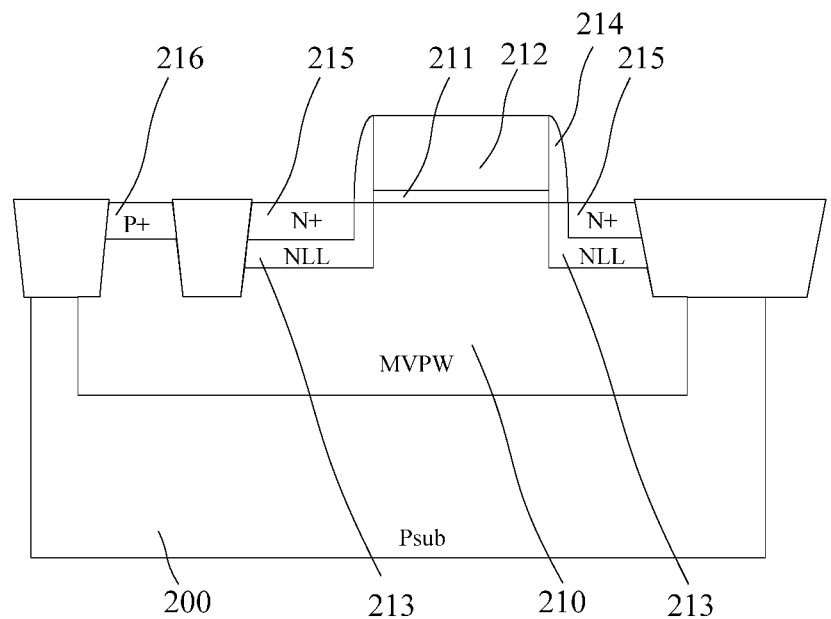
Figure 14:
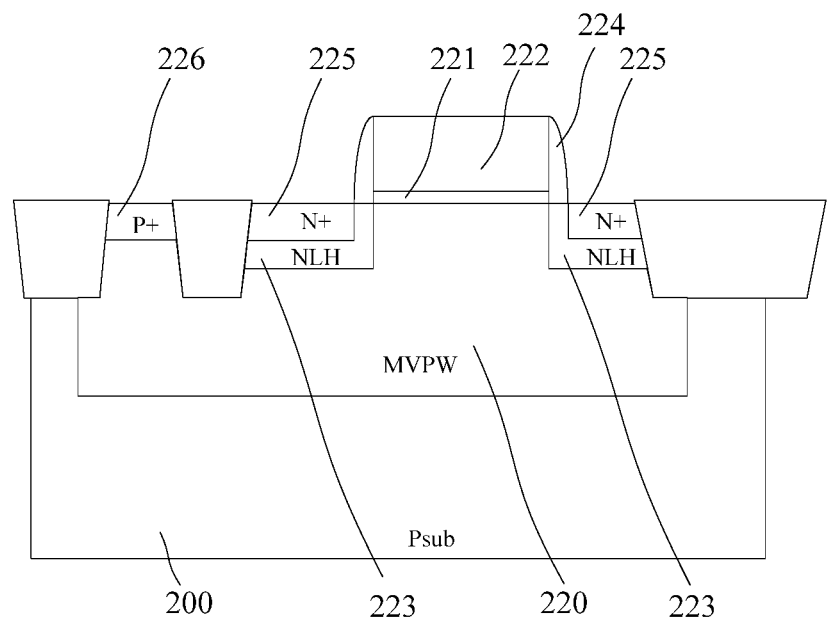

Referring to FIG. 17, after the LDD implant regions are formed in the active regions, N-type heavily-doped regions are formed in the semiconductor substrate on the two sides of each of the first gate structure and the second gate structure (S107). FIGS. 13 and 14 illustrate the corresponding semiconductor structure.

As shown in FIGS. 13 and 14, N-type heavily-doped regions may be formed in the semiconductor substrate 200 on the two sides of each of the first gate structure and the second gate structure. Specifically, N-type heavily-doped regions 215 may be formed in the semiconductor substrate 200 on the two sides of the first gate structure; and N-type heavily-doped regions 225 may be formed in the semiconductor substrate 200 on the two sides of the second gate structure.

In one embodiment, N-type heavily-doped regions may be formed in the semiconductor substrate 200 on the two sides of each of the first gate structure and the second gate structure through a same fabrication step or simultaneously. Specifically, first sidewall spacers 214 may be formed on the two sides of the first gate structure, and second sidewall spacers 224 may be formed on the two sides of the second gate structure. The first sidewall spacers 214 may be used as the mask for performing a fifth ion implantation process on the semiconductor substrate 200 on the two sides of the first gate structure to form the N-type heavily-doped region 215. The second sidewall spacers 224 may be used as the mask for performing the fifth ion implantation on the semiconductor substrate 200 on the two sides of the second gate structure to form the N-type heavily-doped region 225.

In one embodiment, the fifth ion implantation process may be used to form the N-type heavily-doped regions 215 and 225. The ions doped by the fifth ion implantation process may be arsenic ions. The dopant concentration of the fifth ion implantation process may range from about 4.5E15 atom/cm$^2$ to about 5.5E15 atom/cm$^2$. The implantation energy of the fifth ion implantation process may range from about 55 KeV to about 65 KeV.

In one embodiment, the N-type heavily-doped regions on the two sides of each of the first gate structure and the second gate structure may be formed through the same fabrication step or simultaneously. One photolithography process, i.e., including forming the photoresist layer and the corresponding exposure and development processes, may be omitted from the disclosed fabrication method. The number of fabrication steps may be further reduced. Less time is required for the fabrication process of the semiconductor structure. Fabrication efficiency may be improved, and fabrication cost may be reduced. It should be noted that, in other embodiments, the N-type heavily-doped regions on the two sides of the first gate electrode structure and the N-type heavily-doped regions on the two sides of the second gate electrode structure may also be formed through different fabrication steps. The fabrication processes to form the N-type heavily-doped regions 215 on the two sides of the first gate electrode structure and the N-type heavily-doped regions 225 on the two sides of the second gate electrode structure may be the same or may be different.

Referring to FIG. 17, after N-type heavily-doped regions are formed, P-type heavily-doped regions are formed in the semiconductor substrate on the two sides of each of the third gate structure and the fourth gate structure (S108). FIGS. 15 and 16 illustrate the corresponding semiconductor structure.

As shown in FIGS. 15 and 16, P-type heavily-doped regions may be formed in the semiconductor substrate 200 on the two sides of each of the third gate structure and the fourth gate structure. Specifically, P-type heavily-doped regions 235 may be formed in the semiconductor substrate 200 on the two sides of the third gate structure; and P-type heavily-doped regions 244 may be formed in the semiconductor substrate 200 on the two sides of the fourth gate structure.

In one embodiment, P-type heavily-doped regions may be formed in the semiconductor substrate 200 on the two sides of each of the third gate structure and the fourth gate structure through a same fabrication step or simultaneously. Specifically, third sidewall spacers 234 may be formed on the two sides of the third gate structure, and fourth sidewall spacers 243 may be formed on the two sides of the fourth gate structure. The third sidewall spacers 234 may be used as the mask for performing a sixth ion implantation on the semiconductor substrate 200 on the two sides of the third gate structure to form the P-type heavily-doped region 235. The fourth sidewall spacers 243 may be used as the mask for performing the sixth ion implantation on the semiconductor substrate 200 on the two sides of the fourth gate structure to form the P-type heavily-doped region 244.

In one embodiment, a sixth ion implantation process may be used to form the P-type heavily-doped regions. The ions doped by the sixth ion implantation process may be boron ions. The dopant concentration of the sixth ion implantation process may range from about 1E13 atom/cm$^2$ to about 3E13 atom/cm$^2$. The implantation energy of the sixth ion implantation process may range from about 10 KeV to about 20 KeV.

In one embodiment, the P-type heavily-doped regions on the two sides of each of the third gate structure and the fourth gate structure may be formed through the same fabrication step or simultaneously. One photolithography process, i.e., including forming the photoresist layer and the corresponding exposure and development processes, may be omitted from the disclosed fabrication method. The number of fabrication steps may be further reduced. Less time is required for the fabrication process. Fabrication efficiency may be improved, and fabrication cost may be reduced. It should be noted that, in other embodiments, the P-type heavily-doped regions 235 on the two sides of the third gate electrode structure and the P-type heavily-doped regions 244 on the two sides of the fourth gate electrode structure may also be formed through different fabrication steps. The fabrication processes to form the P-type heavily-doped regions 235 on the two sides of the third gate electrode structure and the P-type heavily-doped regions 244 on the two sides of the fourth gate electrode structure may be the same or may be different.

In the fabrication processes described above, when forming the N-type heavily-doped regions in the semiconductor substrate 200 on the two sides of each of the first gate structure and the second gate structure, as shown in FIGS. 13 and 14, an N-type heavily-doped region 326 may be formed in the MVNW region 230 of the third active region, as shown in FIG. 15. Meanwhile, an N-type heavily-doped region 245 may be formed in the MVNW region 240 of the fourth active region, as shown in FIG. 16. The N-type heavily-doped region 236 may be used to control the doping depth, dopant concentration, and surface concentration of the dopants in the MVNW region 230 of the third active region. The N-type heavily-doped region 245 may be used to control the doping depth, dopant concentration, and surface concentration of the dopants in the MVNW region 240 of the fourth active region.

Similarly, in the fabrication processes described above, when forming the P-type heavily-doped regions in the semiconductor substrate 200 on the two sides of each of the third gate structure and the fourth gate structure, as shown in FIGS. 15 and 16, a P-type heavily-doped region 216 may be formed in the MVPW region 210 of the first active region, as shown in FIG. 13. Meanwhile, a P-type heavily-doped region 226 may be formed in the MVPW region 220 of the second active region, as shown in FIG. 14. The P-type heavily-doped region 216 may be used to control the doping depth, dopant concentration, and surface concentration of the dopants in the MVPW region 210 of the first active region. The P-type heavily-doped region 226 may be used to control the doping depth, dopant concentration, and surface concentration of the dopants in the MVPW region 220 of the fourth active region.

It should be noted that, in some other embodiments, after the fifth ion implantation, a seventh ion implantation process may be used to form a second N-type heavily-doped region (not shown in the figures) in the substrate 200 on the two sides of the first gate structure or the second gate structure. The ions doped by the seventh ion implantation process may be phosphorus ions. The dopant concentration of the seventh ion implantation process may range between about 1E14 atom/$cm^2$ to about 2E14 atom/$cm^2$. The implantation energy of the seventh ion implantation process may range about 45 KeV to about 55 KeV. The second N-type heavily-doped region formed by the seventh ion implantation process may reduce the electric filed in the channel region corresponding to the first gate structure or the second gate structure, similar to the functions provided by the LDD implant regions. The N-type heavily-doped region may also prevent short-channel effect and hot carrier effect.

It should also be noted that, in certain other embodiments, after the sixth ion implantation process, an eighth ion implantation process may be performed to form a second P-type heavily-doped region (not shown) in the substrate 200 on the two sides of the third gate structure or the fourth gate structure. The ion doped by the eighth ion implantation process may be $BF_3$ ions. The dopant concentration of the eighth ion implantation process may range between about 1E13 atom/$cm^2$ to about 3E13 atom/$cm^2$. The implantation energy of the eighth ion implantation process may range about 15 KeV to about 25 KeV. The seventh ion implantation process and the eighth ion implantation process may enable the ions, doped by the seventh ion implantation process and the eighth ion implantation process, to distribute more uniformly and diffuse into desired neighboring regions. Thus, parts or regions diffused with the ions, doped through the seventh ion implantation process and the eighth ion implantation process, may not undergo electric breakdown due to abrupt changes in dopant concentrations. The electric field in the channel regions may be reduced. For example, performing the eighth ion implantation process on the fourth active region may form the second P-type heavily-doped region, which may have the functions of a corresponding LDD implant region. The second P-type heavily-doped region may further eliminate or reduce adverse effect caused by not forming an LDD implant region in the fourth active region. Also, because the one addition ion implantation process is performed using the previous photoresist layer as the mask, no additional photoresist layer or related photolithography process is needed.

By using the fabrication method described above, in the semiconductor structure provided by the embodiments of the present disclosure, NMOS transistors with first and second operating voltages of, for example, 1.8 V and 5.0 V may be formed, and PMOS transistors with the first and second operating voltages of 1.8 V and 5.0 V may be formed. Specifically, an NMOS transistor with an operating voltage of 1.8 V may be formed in the first active region; an NMOS transistor with an operating voltage of 5.0 V may be formed in the second active region; a PMOS transistor with an operating voltage of 1.8 V may be formed in the third active region; and a PMOS transistor with an operating voltage of 5.0 V may be formed in the fourth active region.

In the disclosed fabrication method, MVPW region 210 and MVPW region 220 may be formed simultaneously or through a same fabrication step in the first active region and the second active region, respectively. MVNW region 230 and MVNW region 240 may be formed simultaneously or through a same fabrication step in the third active region and the fourth active region, respectively. Subsequent fabrication steps may be performed after the formation of the described MVPW regions and MVNW regions are formed. Because MVPW regions 210 and 220 are formed simultaneously or through a same fabrication step, and MVNW regions 230 and 240 are formed simultaneously or through a same fabrication step, at least two corresponding photolithography processes may be omitted from the disclosed fabrication method. Less fabrication steps and less fabrication time are needed for forming the semiconductor substrate 200. Fabrication efficiency may be improved, and fabrication cost may be reduced.

Another aspect of the present disclosure provides a semiconductor structure. The semiconductor structure may be shown from FIGS. 13 to 16.

The semiconductor structure may include a first active region, a second active region, a third active region, and a fourth active region in a semiconductor substrate 200. The first active region is shown in FIG. 13. The second active region is shown in FIG. 14. The third active region is shown in FIG. 15. The fourth active region is shown in FIG. 16.

As shown in FIG. 13, the first active region may include an MVPW region 210 and a first gate structure on the MVPW region 210. The first gate structure may include a first gate insulating layer 211 and a first gate electrode 212. The first gate structure may also include first sidewall spacers 214 on the two sides of the first gate structure. The MVPW region 210 under the first gate structure may include NLL regions 213 and N-type heavily-doped regions 215. In addition, the MVPW region 210 may also include a P-type heavily-doped region 216, separated from other heavily-doped regions in the MVPW region. The fabrication process to form the semiconductor structure described above may be referred to previous embodiments and is not repeated herein.

As shown in FIG. 14, the second active region may include an MVPW region 220 and a second gate structure on the MVPW region 220. The second gate structure may include a second gate insulating layer 221 and a second gate electrode 222. The second gate structure may also include second sidewall spacers 224 on the two sides of the second gate structure. The MVPW region 220 under the second gate structure may include NLH regions 223 and N-type heavily-doped regions 225. In addition, the MVPW region 220 may also include a P-type heavily-doped region 226, separated from other heavily-doped regions in the MVPW region. The fabrication process to form the semiconductor structure described above may be referred to previous embodiments and is not repeated herein.

In one embodiment, the doped ions or dopants in the described MVPW regions may include boron ions and $BF_3$ ions. The dopant concentration of the boron ions may range from about 1E12 atom/cm$^2$ to about 2.5E12 atom/cm$^2$. The dopant concentration of the $BF_3$ ions may range from about 1E12 atom/cm$^2$ to about 2.5E12 atom/cm$^2$.

In one embodiment, the dopant concentration of the NLL regions may range from about 1E13 atom/cm$^2$ to about 2.5E13 atom/cm$^2$.

As shown in FIG. 15, the third active region may include an MVNW region 230 and a third gate structure on the MVNW region 230. The third gate structure may include a third gate insulating layer 231 and a third gate electrode 232. The third gate structure may also include third sidewall spacers 234 on the two sides of the third gate structure. The MVNW region 230 under the third gate structure may include NLH regions 233 and P-type heavily-doped regions 235. In addition, the MVNW region 230 may also include an N-type heavily-doped region 236, separated from other heavily-doped regions in the MVNW region. The fabrication process to form the semiconductor structure described above may be referred to previous embodiments and is not repeated herein.

As shown in FIG. 16, the fourth active region may include an MVNW region 240 and a fourth gate structure on the MVNW region 240. The fourth gate structure may include a fourth gate insulating layer 241 and a fourth gate electrode 242. The fourth gate structure may also include fourth sidewall spacers 243 on the two sides of the fourth gate structure. The MVNW region 240 under the fourth gate structure may include P-type heavily-doped regions 244. In addition, the MVNW region 240 may also include an N-type heavily-doped region 245, separated from other heavily-doped regions in the MVNW region. The fabrication process to form the semiconductor structure described above may be referred to previous embodiments and is not repeated herein.

In one embodiment, the dopant concentration of the MVNW regions may range from about 1E12 atom/cm$^2$ to about 1E13 atom/cm$^2$.

In one embodiment, the dopant concentration of the NLH regions 223 may be the same as the dopant concentration of the NLH regions 233.

In one embodiment, the dopant concentration of the NLH regions may range from about 8E12 atom/cm$^2$ to about 1E13 atom/cm$^2$.

In one embodiment, the dopant concentration of each N-type heavily-doped region may range from about 4.5E15 atom/cm$^2$ to about 5.5E15 atom/cm$^2$; and the dopant concentration of each P-type heavily-doped region may range from about 1E13 atom/cm$^2$ to about 3E13 atom/cm$^2$.

It should be noted that, in some other embodiments, the disclosed semiconductor structure may also include a second N-type heavily-doped region and/or a second P-type heavily doped region. The dopant concentration of the second N-type heavily-doped region may range from about 1E14 atom/cm$^2$ to about 2E14 atom/cm$^2$; and the dopant concentration of the second P-type heavily-doped region may range from about 1E12 atom/cm$^2$ to about 2.5E12 atom/cm$^2$.

In the disclosed semiconductor structure, NMOS transistors with operating voltages of 1.8 V and 5.0 V may be formed, and PMOS transistors with operating voltages of 1.8 V and 5.0 V may be formed. In addition, the NMOS transistors, with operating voltages of 1.8 V and 5.0 V, may be formed in the MVPW regions; and the PMOS transistors, with operating voltages of 1.8 V and 5.0 V, may be formed in the MVNW regions. The structure of the disclosed semiconductor structure may be simplified, and the fabrication process to form the semiconductor structure may be simplified accordingly.

Meanwhile, in the disclosed semiconductor structure, the NMOS transistor with a first operating voltage of 1.8 V may include NLL regions, the NMOS transistor with a second operating voltage of 5.0 V may include NLH regions, and the PMOS transistor with a first operating voltage of 1.8 V may include NLH regions. The NLH regions in the MVPW region and the NLH regions in the MVNW region may be formed through the same fabrication step. No LDD implant regions may be formed in the PMOS transistor region with a second operating voltage of 5.0 V. The structure of the disclosed semiconductor structure may be further simplified, and the fabrication process of the disclosed semiconductor structure may be further simplified accordingly.

Meanwhile, in the disclosed semiconductor structure, the NMOS transistors with operating voltages of 1.8 V and 5.0 V may each include a P-type heavily-doped region, and the PMOS transistors with operating voltages of 1.8 V and 5.0 V may each include an N-type heavily-doped region. The structure of the disclosed semiconductor structure may be further simplified, and the fabrication process of the disclosed semiconductor structure may be further simplified accordingly.

In the embodiments of the present disclosure, the dopant concentration and the implantation energy may be controlled in each ion implantation process so that the corresponding doped regions, e.g., each well, each LDD implant region, and each heavily-doped region, may possess desired electrical properties. The formed MOS transistors may also possess desired electrical properties. That is, the electrical properties of the MOS transistors formed by the disclosed fabrication method may be the same or sufficiently close to the MOS transistors formed by the existing fabrication method.

The present disclosure includes several advantages.

In the technical solution provided by the present disclosure, after forming the first active region, the second active region, the third active region, and the fourth active region in the semiconductor substrate, MVPW regions may be formed in the first active region and the second active region simultaneously, e.g., through a same fabrication step, and MVNW regions may be formed in the third active region and the fourth active region simultaneously, e.g., through a same fabrication step. Subsequent fabrication steps may then be performed. Because MVPW regions are formed in the first active region and the second active region through the same fabrication step, and MVNW region are formed in the third active region and the fourth active region through the same fabrication step, at least two photolithography processes may be omitted. Less fabrication steps are needed. Less time is required to form the disclosed semiconductor structure. Fabrication efficiency may be improved and the fabrication process may be less costly.

Further, LDD implant regions are only formed in the first active region, the second active region, and the third active region, and no LDD implant regions are formed in the fourth active region. In addition, the LDD implant regions in the second active region and the third active region may be formed through the same fabrication step, and only two LDD ion implantation processes are needed in the disclosed fabrication process to form the LDD implant regions. Compared to the existing fabrication process, which requires four LDD ion implantation processes to form the LDD implant regions, the number of fabrication steps can be reduced, and less fabrication steps are needed. Fabrication efficiency may be improved and the fabrication process of the semiconductor substrate may be less costly.

Compared to conventional MOS transistors, the MOS transistors formed using the disclosed fabrication method may have lower threshold voltages, higher saturation current, higher off current, and higher breakdown voltages.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

What is claimed is:

1. A method for forming a semiconductor structure, comprising:
   providing a semiconductor substrate;
   forming a first active region, a second active region, a third active region, and a fourth active region in the semiconductor substrate, wherein the first active region and the second active region are configured to form NMOS transistors and the third active region and the fourth active region are configured to form PMOS transistors;
   performing a first ion implantation process to form a middle-voltage P well (MVPW) region in each of the first active region and the second region simultaneously and simultaneously performing a second ion implantation process to form a middle-voltage N well (MVNW) region in each of the third active region and the fourth active region; and
   performing a third ion implantation process to dope the first active region, and simultaneously performing a fourth ion implantation process to dope the second active region and the third active region, wherein the first active region is configured to form a NMOS transistor with an operating voltage of 1.8 V, the second active region is configured to form a NMOS transistor with an operating voltage of 5.0 V, the third active region is configured to form a PMOS transistor with an operating voltage of 1.8 V, and the fourth active region is configured to form a PMOS transistor with an operating voltage of 5.0 V.

2. The method according to claim 1, further including:
   forming a first gate structure on the MVPW region of the first active region, a second gate structure on the MVPW region of the second active region, a third gate structure on the MVNW region of the third active region, and a fourth gate structure on the MVNW region of the fourth active region;
   using the first gate structure as a mask to perform the third ion implantation process for forming NMOS lightly-doped implant for low voltage (NLL) regions in the first active region;
   using the second gate structure and the third gate structure as masks to perform the fourth ion implantation process for simultaneously forming NMOS lightly-doped implant for high voltage (NLH) regions in the second active region and in the third active region; and
   forming N-type heavily-doped regions in the first active region and the second active region and P-type heavily-doped regions in the third active region and the fourth active region.

3. The method according to claim 2, wherein:
   the N-type heavily-doped region are formed in the semiconductor substrate on two sides of the first gate structure and on two sides of the second gate structure simultaneously; and
   the P-type heavily-doped region are formed in the semiconductor substrate on two sides of the third gate structure and on two sides of the fourth gate structure simultaneously.

4. A method for forming a semiconductor structure, comprising:
   providing a semiconductor substrate;
   forming a first active region, a second active region, a third active region, and a fourth active region in the semiconductor substrate; and
   forming a middle-voltage P well (MVPW) region in each of the first active region and the second region simultaneously and forming a middle-voltage N well (MVNW) region in each of the third active region and the fourth active region simultaneously, wherein a first ion implantation process is used to form the MVPW regions, the first ion implantation process including two steps, wherein:
   in a first step, doped ions are boron ions with a dopant concentration ranging from about 1E12 atom/cm$^2$ to about 2.5E12 atom/cm$^2$, an implantation energy of the first step ranging from about 90 KeV to about 110 KeV; and
   in a second step, doped ions are BF$_3$ ions with a dopant concentration ranging from about 1E12 atom/cm$^2$ to about 2.5E12 atom/cm$^2$, an implantation energy of the second step ranging from about 10 KeV to about 20 KeV.

5. The method according to claim 1, wherein the second ion implantation process is used to form the MVNW regions, a dopant concentration of the second ion implantation ranging from about 1E12 atom/cm$^2$ to about 3E12 atom/cm$^2$, and an implantation energy of the second ion implantation ranging from about 70 KeV to about 100 KeV.

6. The method according to claim 2, wherein the third ion implantation process is used to form the NLL regions, a dopant concentration of the third ion implantation ranging from about 1E13 atom/cm$^2$ to about 2.5E13 atom/cm$^2$, and an implantation energy of the third ion implantation ranging from about 20 KeV to about 30 KeV.

7. The method according to claim 2, wherein the fourth ion implantation process is used to form the NLH regions in the second active region and the NLH regions in the third active region, a dopant concentration of the fourth ion implantation ranging from about 8E12 atom/cm$^2$ to about 1E13 atom/cm$^2$, and an implantation energy of the fourth ion implantation ranging from about 60 KeV to about 85 KeV.

8. The method according to claim 3, wherein a fifth ion implantation process is performed to form the N-type heavily-doped regions and a sixth ion implantation process is performed to form the P-type heavily-doped regions, wherein:

ions doped by the fifth ion implantation process are arsenic ions with a dopant concentration ranging from about 4.5E15 atom/cm$^2$ to about 5.5E15 atom/cm$^2$, and an implantation energy of the fifth ion implantation process ranging from about 55 KeV to about 65 KeV; and ions doped by the sixth ion implantation process are boron ions with a dopant concentration ranging from about 1E13 atom/cm$^2$ to about 3E13 atom/cm$^2$, an implantation energy of the sixth ion implantation process ranging from about 10 KeV to about 20 KeV.

9. The method according to claim 8, wherein:

after the fifth ion implantation process, a seventh ion implantation process is performed to form a second N-type heavily-doped region, ions doped by the seventh ion implantation process being phosphorous ions with a dopant concentration ranging from about 1E14 atom/cm$^2$ to about 2E14 atom/cm$^2$, and an implantation energy of the seventh ion implantation being about 45 KeV to about 55 KeV; and after the sixth ion implantation process, an eighth ion implantation process is performed to form a second P-type heavily-doped region, ions doped by the eighth ion implantation process being BF$_3$ ions with a dopant concentration ranging from about 1E13 atom/cm$^2$ to about 3E13 atom/cm$^2$, and an implantation energy of the eighth ion implantation being about 15 KeV to about 25 KeV.

10. A semiconductor structure, comprising:

a semiconductor substrate;

a first active region, including a middle-voltage P well (MVPW) region and a first gate structure on the MVPW region, NMOS lightly-doped-drain implant for low VDD (NLL) regions and N-type heavily-doped regions being formed in the MVPW region on two sides of the first gate structure;

a second active region, including an MVPW region and a second gate structure on the MVPW region, NMOS lightly-doped-drain implant for high VDD (NLH) and N-type heavily-doped regions being formed in the MVPW region on two sides of the second gate structure;

a third active region, including a middle-voltage N well (MVNW) region and a third gate structure on the MVNW region, NLH regions and P-type heavily-doped regions being formed in the MVNW region on two sides of the third gate structure; and a fourth active region, including an MVNW region and a fourth gate structure on the MVNW region, and P-type heavily-doped regions being formed in the MVNW region on two sides of the fourth gate structure, wherein dopants of the MVPW regions include boron ions and BF$_3$ ions, a concentration of the boron ions ranging from about 1E12 atom/cm$^2$ to about 2.5E12 atom/cm$^2$, and a concentration of the BF$_3$ ions ranging from about 1E12 atom/cm$^2$ to about 2.5E12 atom/cm$^2$.

11. The semiconductor structure according to claim 10, wherein a dopant concentration of the NLH regions in the second active region is same as a dopant concentration of the NLH regions in the third active region.

12. The semiconductor structure according to claim 10, wherein a dopant concentration of the MVNW regions ranges from about 1E12 atom/cm$^2$ to about 3E12 atom/cm$^2$.

13. The semiconductor structure according to claim 10, wherein a dopant concentration of the NLL regions ranges from about 1E13 atom/cm$^2$ to about 2.5E13 atom/cm$^2$.

14. The semiconductor structure according to claim 10, wherein a dopant concentration of the NLH regions ranges from about 8E12 atom/cm$^2$ to about 1E13 atom/cm$^2$.

15. The semiconductor structure according to claim 10, wherein a dopant concentration of the N-type heavily-doped regions ranges from about 4.5E15 atom/cm$^2$ to about 5.5E15 atom/cm$^2$, and a dopant concentration of the P-type heavily-doped regions ranges from about 1E13 atom/cm$^2$ to about 3E13 atom/cm$^2$.

16. The semiconductor structure according to claim 15, further including a second N-type heavily-doped region and a second P-type heavily-doped region, wherein:

a dopant concentration of the second N-type heavily-doped region ranges from about 1E14 atom/cm$^2$ to about 2E14 atom/cm$^2$, and a dopant concentration of the second P-type heavily-doped region ranges from about 1E12 atom/cm$^2$ to about 2.5E12 atom/cm$^2$.

17. The method according to claim 1, wherein the MVPW region is a well region configured to form a NMOS transistor with operating voltages ranging between 3 V to 10 V.

18. The method according to claim 4, further comprising:

performing a second ion implantation process to form the MVNW regions, a dopant concentration of the second ion implantation ranging from about 1E12 atom/cm$^2$ to about 3E12 atom/cm$^2$, and an implantation energy of the second ion implantation ranging from about 70 KeV to about 100 KeV.

19. The method according to claim 18, further comprising:

forming a first gate structure on the MVPW region of the first active region, a second gate structure on the MVPW region of the second active region, a third gate structure on the MVNW region of the third active region, and a fourth gate structure on the MVNW region of the fourth active region;

using the first gate structure as a mask to perform a third ion implantation process for forming NMOS lightly-doped implant for low voltage (NLL) regions in the first active region;

using the second gate structure and the third gate structure as masks to perform a fourth ion implantation process for simultaneously forming NMOS lightly-doped implant for high voltage (NLH) regions in the second active region and in the third active region; and forming N-type heavily-doped regions in the first active region and the second active region and P-type heavily-doped regions in the third active region and the fourth active region.

* * * * *